United States Patent
Clark, Jr. et al.

(10) Patent No.: US 8,017,489 B2
(45) Date of Patent: Sep. 13, 2011

(54) FIELD EFFECT STRUCTURE INCLUDING CARBON ALLOYED CHANNEL REGION AND SOURCE/DRAIN REGION NOT CARBON ALLOYED

(75) Inventors: William F. Clark, Jr., Essex Junction, VT (US); Ephrem G. Gebgreselasie, Shelburne, VT (US); Xuefeng Liu, South Burlington, VT (US); Robert Russell Robison, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 634 days.

(21) Appl. No.: 12/047,355

(22) Filed: Mar. 13, 2008

(65) Prior Publication Data
US 2009/0230475 A1    Sep. 17, 2009

(51) Int. Cl.
*H01L 29/72* (2006.01)
(52) U.S. Cl. .......... 438/341; 438/44; 438/197; 438/299; 438/300
(58) Field of Classification Search .................... 438/44, 438/197, 299, 300, 341
See application file for complete search history.

(56) References Cited

U.S. PATENT DOCUMENTS

| | | | |
|---|---|---|---|
| 4,885,614 A | 12/1989 | Furukawa et al. | |
| 4,994,866 A | 2/1991 | Awano | |
| 5,534,713 A | 7/1996 | Ismail et al. | |
| 5,667,586 A | 9/1997 | Ek et al. | |
| 6,674,100 B2 | 1/2004 | Kubo et al. | |
| 6,885,041 B2 | 4/2005 | Awano | |
| 7,060,582 B2 | 6/2006 | Koumoto et al. | |
| 7,145,166 B2 | 12/2006 | Lee | |
| 2002/0109135 A1 | 8/2002 | Muroto et al. | |
| 2005/0104092 A1 | 5/2005 | Koester | |
| 2007/0105331 A1* | 5/2007 | Murthy et al. | 438/341 |
| 2008/0272408 A1* | 11/2008 | Vora | 257/272 |

FOREIGN PATENT DOCUMENTS

| | | |
|---|---|---|
| EP | 0683522 | 4/1995 |
| EP | 0703628 | 11/1995 |

* cited by examiner

*Primary Examiner* — Edward Wojciechowicz
(74) *Attorney, Agent, or Firm* — Scully, Scott, Murphy & Presser, P.C.; Richard M. Kotulak, Esq.

(57) ABSTRACT

A semiconductor structure and a method for fabricating the semiconductor structure provide a field effect device structure. The field effect device structure includes a gate electrode located over a channel region within a semiconductor substrate that separates a plurality of source and drain regions within the semiconductor substrate. The channel region includes a surface layer that comprises a carbon doped semiconductor material. The source and drain regions include a surface layer that comprises a semiconductor material that is not carbon doped. The particular selection of material for the channel region and source and drain regions provide for inhibited dopant diffusion and enhanced mechanical stress within the channel region, and thus enhanced performance of the field effect device.

10 Claims, 3 Drawing Sheets

FIELD EFFECT STRUCTURE INCLUDING CARBON ALLOYED CHANNEL REGION AND SOURCE/DRAIN REGION NOT CARBON ALLOYED

BACKGROUND

1. Field of the Invention

The invention relates generally to field effect structures. More particularly, the invention relates to field effect structures with enhanced performance.

2. Description of the Related Art

As semiconductor fabrication technology has advanced and semiconductor device dimensions have decreased, a need to effectively and accurately control the dimensions of layers and regions that are used for fabricating semiconductor structures often becomes considerably more pronounced. To that end, an inadequate dimensional control when fabricating such layers and regions within semiconductor structures often provides for compromised performance of semiconductor devices that comprise the semiconductor structures.

While effective dimensional control of layers and regions is thus desirable within the semiconductor fabrication art, effective dimensional control is nonetheless not entirely without problems. Notably, dopant diffusion effects are often particularly detrimental with respect to dimensional control of doped semiconductor regions within semiconductor structures, since while as noted above semiconductor structure dimensions continue to decrease, a particular diffusion coefficient for a particular dopant within a particular semiconductor material is generally constant.

Various semiconductor structures having desirable properties are known in the semiconductor fabrication art.

For example, Furukawa et al., in U.S. Pat. No. 4,885,614, and Kuomoto et al., in U.S. Pat. No. 7,060,582, each teach the use of specific silicon-germanium alloy layer and silicon-germanium-carbon alloy layer combinations for avoiding misfit dislocations when fabricating bipolar transistor structures.

In addition Ismail et al., in EP 0 683 522 and U.S. Pat. No. 5,534,713, teaches a complementary metal oxide semiconductor field effect transistor structure that comprises a layered planar heterostructure that includes a tensile stressed silicon or silicon-germanium alloy layer, as well as a compressive stressed silicon-germanium alloy layer. The layered planar heterostructure provides for simultaneously optimized nFET performance and pFET performance within the complementary metal oxide semiconductor field effect transistor structure.

Further, each of: (1) Awano, in U.S. Pat. No. 4,994,866; (2) Canelaria et al., in EP 0 703 628; (3) Ek et al., in U.S. Pat. No. 5,667,586; (4) Kubo et al., in U.S. Pat. No. 6,674,100; (5) Koester, in U.S. Pub. No. 2005/0104092; and (6) Lee, in U.S. Pat. No. 7,145,166 teaches multilayer combinations that may under certain circumstances include silicon-germanium-carbon alloy layers for enhanced performance within semiconductor structures, including but not limited to semiconductor laser structures and metal oxide semiconductor field effect transistor structures.

Finally, Murota, et al., in U.S. Publication No. 2002/0109135 and Awano, in U.S. Pat. No. 6,885,041 each teach a metal oxide semiconductor field effect transistor structure that includes source and drain regions that may comprise different base semiconductor materials in comparison with channel regions within the metal oxide semiconductor field effect transistor structures, to effect enhanced performance of metal oxide semiconductor field effect transistor devices within the metal oxide semiconductor field effect transistor structures.

Semiconductor structure dimensions, and related semiconductor device dimensions, are certain to continue to decrease as semiconductor technology advances. Thus, desirable are semiconductor structures and semiconductor devices having enhanced performance at decreased dimensions, and methods for fabricating those semiconductor structures and semiconductor devices.

SUMMARY

The invention provides a semiconductor structure and a method for fabricating the semiconductor structure. The semiconductor structure includes a field effect device having a channel region that includes a surface layer comprising a carbon alloyed semiconductor material, where the channel region separates a plurality of source and drain regions that include a surface layer that comprises a semiconductor material that is not carbon alloyed. The use of the carbon alloyed semiconductor material for the surface layer within the channel region provides for inhibited dopant diffusion within (i.e., including to and from) the channel region. Under particular circumstances, the use of different materials for the channel region and the source and drain regions provides for optimized mechanical stress engineering within the field effect device that is included within the semiconductor structure.

A particular semiconductor structure in accordance with the invention includes a semiconductor substrate. This particular semiconductor structure also includes a gate electrode located over a channel region within the semiconductor substrate that separates a plurality of source and drain regions within the semiconductor substrate. Within the semiconductor structure: (1) the channel region includes a surface layer that comprises a carbon alloyed semiconductor material; and (2) the plurality of source and drain regions includes a surface layer that comprises a semiconductor material that is not carbon alloyed.

A particular method for fabricating a semiconductor structure in accordance with the invention includes providing a semiconductor substrate that comprises a carbon alloyed semiconductor surface layer. This particular method also includes forming a gate electrode over the semiconductor substrate. This particular method also includes etching the semiconductor substrate while using the gate electrode as a mask to form a carbon alloyed semiconductor channel aligned beneath the gate electrode. This particular method also includes forming laterally backfilling adjoining the carbon alloyed semiconductor channel region a plurality of source and drain regions that comprise a semiconductor material that is not carbon alloyed.

Another particular method for fabricating a semiconductor structure in accordance with the invention includes providing a structure including a first semiconductor material layer located over a substrate and having a first mechanical stress. This other particular method also includes etching laterally separated portions of the first semiconductor material layer to leave remaining a first semiconductor material layer mesa from which the first mechanical stress is at least in part relaxed. This other particular method also includes forming backfilled laterally adjoining the first semiconductor material layer mesa a backfilling semiconductor material layer that induces a second stress different than the first stress into the first semiconductor material layer mesa.

BRIEF DESCRIPTION OF THE DRAWINGS

The objects, features and advantages of the invention are understood within the context of the Description of the Preferred Embodiment, as set forth below. The Description of the preferred Embodiment is understood within the context of the accompanying drawings, which form a material part of this disclosure, wherein.

DESCRIPTION OF THE PREFERRED EMBODIMENT

The invention, which includes a semiconductor structure and a method for fabricating the semiconductor structure, is understood within the context of the description set forth below. The description set forth below is understood within the context of the accompanying drawings that are described above. Since the accompanying drawings are intended for illustrative purposes, the accompanying drawings are not necessarily drawn to scale.

Figure 1:
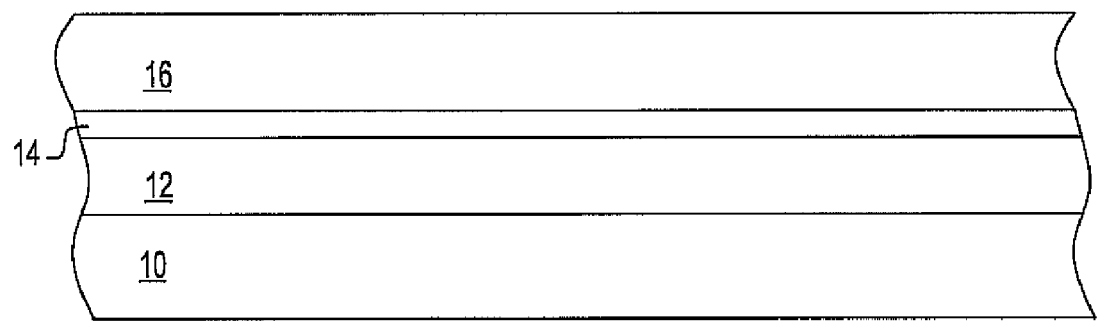
FIG. 1 to FIG. 6 show a series of schematic cross-sectional diagrams illustrating the results of progressive stages in fabricating a semiconductor structure in accordance with a particular embodiment of the invention.

FIG. 1 to FIG. 6 show a series of schematic cross-sectional diagrams illustrating the results of progressive stages in fabricating a semiconductor structure in accordance with a particular embodiment of the invention. This particular embodiment of the invention comprises a sole preferred embodiment of the invention. FIG. 1 shows a schematic cross-sectional diagram of the semiconductor structure at an early stage in the fabrication thereof in accordance with this particular sole preferred embodiment of the invention.

FIG. 1 shows a base semiconductor substrate 10. A buried dielectric layer 12 is located upon the base semiconductor substrate 10. An intermediate semiconductor layer 14 is located upon the buried dielectric layer 12, and finally, a surface semiconductor layer 16 is located upon the intermediate semiconductor layer 14. In an aggregate, the base semiconductor substrate 10, the buried dielectric layer 12, the intermediate semiconductor layer 14 and the surface semiconductor layer 16 comprise a semiconductor-on-insulator substrate.

The base semiconductor substrate 10 may comprise any of several semiconductor materials. Non-limiting examples include silicon, germanium, silicon-germanium alloy, silicon-carbon alloy, silicon-germanium-carbon alloy and compound (i.e., III-V and II-VI) semiconductor materials. Non-limiting examples of compound semiconductor materials include gallium arsenide, indium arsenide and indium phosphide semiconductor materials. Typically, the base semiconductor substrate 10 has a generally conventional thickness.

The buried dielectric layer 12 may comprise any of several dielectric materials. Non-limiting examples include oxides, nitrides and oxynitrides, particularly of silicon, but oxides, nitrides and oxynitrides of other elements are not excluded. The buried dielectric layer 12 may comprise a crystalline or a non-crystalline dielectric material, with crystalline dielectric materials being highly preferred. The buried dielectric layer 12 may be formed using any of several methods. Non-limiting examples include ion implantation methods, thermal or plasma oxidation or nitridation methods, chemical vapor deposition methods and physical vapor deposition methods. Typically, the buried dielectric layer 12 comprises an oxide of the semiconductor material from which is comprised the semiconductor substrate 10. Typically, the buried dielectric layer 12 has a generally conventional thickness from about 100 to about 200 nanometers.

The intermediate semiconductor layer 14 may be present for purposes of providing a base semiconductor layer upon which the surface semiconductor layer 16 may be formed. Under certain circumstances, the intermediate semiconductor layer 14 is desirably an unstrained semiconductor layer that provides a base semiconductor layer for forming a strained surface semiconductor layer 16. While by no means limiting the embodiment or the invention, the intermediate semiconductor layer 14 typically comprises an unstrained semiconductor material such as but not limited to an unstrained silicon semiconductor material. Thus, the intermediate semiconductor layer 14 may comprise the same or different semiconductor material as the base semiconductor substrate 10, provided that such semiconductor material from which is comprised the intermediate semiconductor layer 14 provides an appropriate crystallographic base with respect to the surface semiconductor layer 16. Typically, the intermediate semiconductor layer 14 comprises an unstrained silicon semiconductor material that has a thickness from about 10 to about 20 nanometers.

Within the embodiment and the invention, the surface semiconductor layer 16 comprises a carbon alloyed semiconductor material that preferably comprises a carbon alloyed strained semiconductor material. Such a carbon alloyed strained semiconductor material may be formed using an epitaxial chemical vapor deposition method that further employs appropriate carbon and semiconductor source materials. Typically, but not exclusively, the carbon alloyed semiconductor material from which is comprised the surface semiconductor layer 16 may comprise, but is not necessarily limited to, a silicon-carbon alloy semiconductor material, a germanium-carbon alloy semiconductor material or a silicon-germanium-carbon alloy semiconductor material. Typically, the surface semiconductor layer 16 comprises a silicon-germanium-carbon alloy semiconductor material that has a thickness from about 30 to about 70 nanometers.

Within the context of the instant embodiment, the surface semiconductor layer 16 which is comprised of the carbon alloyed semiconductor material (i.e., and preferably the silicon-germanium-carbon alloy semiconductor material) preferably possesses a tensile stress, by virtue of being deposited upon the preferably unstrained intermediate semiconductor layer 14 that comprises a silicon semiconductor material that is not carbon or germanium alloyed. Typically, such a tensile stress is from about 200 to about 600 MPa. However, the forgoing materials combinations do not necessarily limit the embodiment with respect to a particular type or magnitude of stress. Rather, different materials compositions, and in particular different elemental percentages of different materials compositions, may affect a magnitude of stress and a type of stress within the intermediate semiconductor layer 14 and the surface semiconductor layer 16.

The semiconductor-on-insulator substrate that is illustrated in FIG. 1 may be fabricated using any of several methods. Non-limiting examples generally include lamination methods, layer transfer methods and separation by implantation of oxygen (SIMOX) methods. In particular with respect to the instant embodiment, the semiconductor-on-insulator substrate that is illustrated in FIG. 1 may be fabricated in a first instance as a silicon semiconductor-on-insulator substrate that includes the base semiconductor substrate 10, the buried dielectric layer 12 and the intermediate semiconductor layer 14. The surface semiconductor layer 16, which preferably comprises the silicon-germanium-carbon alloy semiconductor material, may be formed upon the silicon semiconductor-on-insulator substrate while using an epitaxial chemical vapor deposition method.

Although the instant embodiment illustrates the invention within the context of a semiconductor-on-insulator substrate comprising the base semiconductor substrate 10, the buried dielectric layer 12, the intermediate semiconductor layer 14 and the surface semiconductor layer 16, neither the embodiment, nor the invention, is so limited. Rather, the embodiment and the invention may alternatively be practiced using a bulk semiconductor substrate (that would otherwise result from absence of the buried dielectric layer 12 under circumstances where the base semiconductor substrate 10 and the intermediate semiconductor layer 14 have identical chemical composition and crystallographic orientation). The embodiment and the invention also contemplate use of a hybrid orientation (HOT) substrate that has multiple semiconductor regions having different crystallographic orientations that are supported upon a single substrate.

Figure 2:
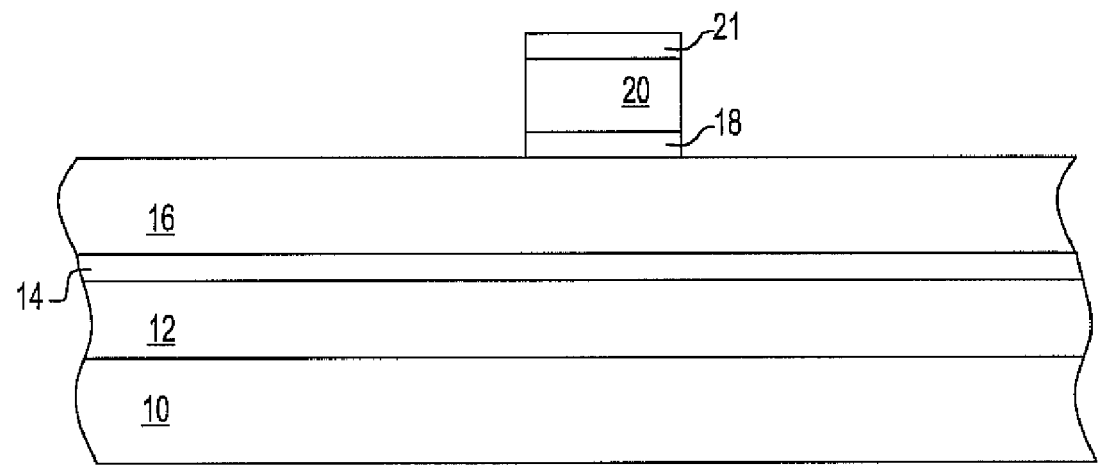

FIG. 2 shows: (1) a gate dielectric 18 located upon the surface semiconductor layer 16; (2) a gate electrode 20 located aligned upon the gate dielectric 18; and (3) a capping layer 21 located aligned upon the gate electrode 20. Each of the foregoing layers may comprise materials and have dimensions that are generally conventional in the semiconductor fabrication art. Each of the foregoing layers and structures may also be formed using methods that are generally conventional in the semiconductor fabrication art.

The gate dielectric 18 may comprise conventional dielectric materials such as oxides, nitrides and oxynitrides of silicon that have a dielectric constant from about 4 to about 20, measured in vacuum. Alternatively, the gate dielectric 18 may comprise generally higher dielectric constant dielectric materials having a dielectric constant from about 20 to at least about 100. Such higher dielectric constant dielectric materials may include, but are not necessarily limited to, hafnium oxides, hafnium silicates, titanium oxides, barium-strontium-titantates (BSTs) and lead-zirconate-titanates (PZTs).

The gate dielectric 18 may be formed using any of several methods that are appropriate to its material(s) of composition. Non-limiting examples include thermal or plasma oxidation or nitridation methods, chemical vapor deposition methods and physical vapor deposition methods. Typically, the gate dielectric 18 comprises a higher dielectric constant dielectric material that has a generally conventional thickness in a range from about 1 to about 3 nanometers.

The gate electrode 20 may comprise materials including but not limited to certain metals, metal alloys, metal nitrides and metal silicides, as well as laminates thereof and composites thereof. The gate electrode 20 may also comprise doped polysilicon and doped polysilicon-germanium alloy materials (i.e., having a dopant concentration from about 1e18 to about 1e22 dopant atoms per cubic centimeter) and polycide materials (doped polysilicon (or polysilicon-germanium alloy)/metal silicide stack materials). Similarly, the foregoing materials may also be formed using any of several methods. Non-limiting examples include salicide methods, chemical vapor deposition methods and physical vapor deposition methods, such as, but not limited to evaporative methods and sputtering methods. Typically, the gate electrode 20 comprises an appropriately selected metal material that has a generally conventional thickness in a range from about 50 to about 100 nanometers. The metal material may be appropriately selected within the context of desirable work function properties of the metal material.

The capping layer 21 may comprise any of several capping materials. Dielectric capping materials are most common. Non-limiting examples of dielectric capping materials may include oxides, nitrides and oxynitrides of silicon, but oxides, nitrides and oxynitrides of other elements are not excluded. The dielectric capping materials may be formed using any of the several methods that may be used for forming the buried dielectric layer 12. Typically, the capping layer 21 comprises a silicon oxide and/or silicon nitride dielectric material that has a generally conventional thickness from about 50 to about 80 nanometers. The capping layer 21 typically serves as a hard mask layer.

Figure 3:
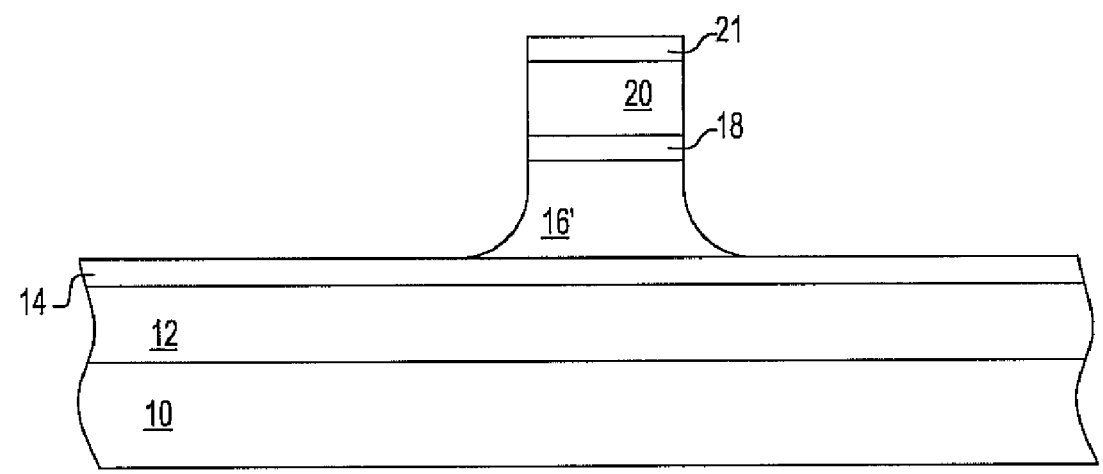

FIG. 3 shows the results of etching the surface semiconductor layer 16 to form a carbon alloyed semiconductor channel 16', while using the capping layer 21, the gate electrode 20 and the gate dielectric 18 as a mask. As is illustrated within the schematic cross-sectional diagram of FIG. 3, the foregoing etching may be undertaken using the intermediate semiconductor layer 14 as a etch stop layer or an etch indicator layer, although the use of the intermediate semiconductor 14 as such an etch stop layer or an etch indicator layer is not necessarily intended as a limitation of the embodiment, or of the invention.

The foregoing etching of the surface semiconductor layer 16 to form the carbon alloyed semiconductor channel 16' may be effected using methods and materials that are otherwise generally conventional in the semiconductor fabrication art. Included in particular, but also not limited, are wet chemical etch methods, dry plasma etch methods and combinations of wet chemical etch methods and dry plasma etch methods. In general, dry plasma etch methods are preferred insofar as dry plasma etch methods often provide comparatively straight sidewalls to the carbon alloyed semiconductor channel region 16'. Wet chemical etch methods are not precluded, and both wet chemical etch methods and dry plasma etch methods may yield somewhat curved sidewall surfaces to the carbon alloyed semiconductor channel 16', as is illustrated in FIG. 3.

As is understood by a person skilled in the art, etching of the surface semiconductor layer 16 to form the carbon alloyed semiconductor channel 16' will have a tendency to relax an initial tensile stress within the surface semiconductor layer 16. Thus, the carbon alloyed semiconductor channel 16' is typically unstressed. Typically, the carbon alloyed semiconductor channel 16' will become unstressed at a linewidth less than about 50 nanometers.

Figure 4:
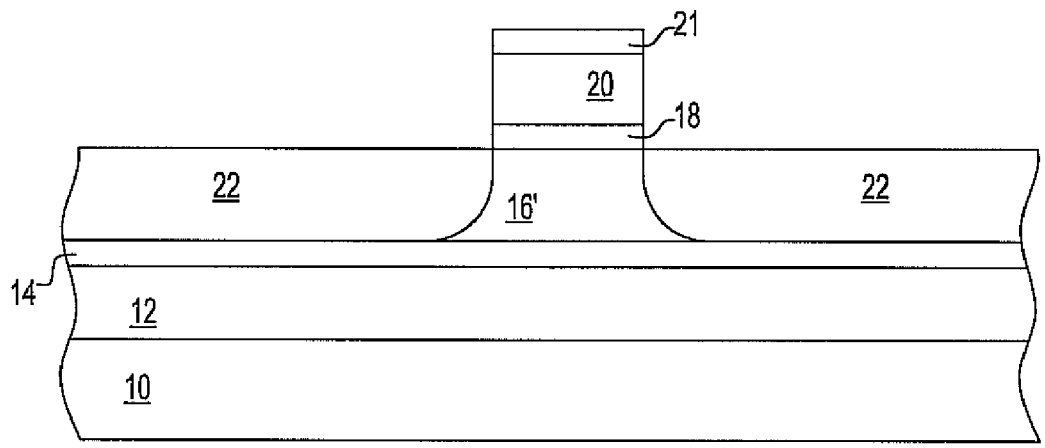

FIG. 4 shows a schematic cross-sectional diagram illustrating the results of further processing of the semiconductor structure whose schematic cross-sectional diagram is illustrated in FIG. 3.

FIG. 4 shows a plurality of source and drain layers 22 located and formed laterally adjoining and backfilling the carbon alloyed semiconductor channel 16'. Within the embodiment, the plurality of source and drain layers 22 comprises a semiconductor material that is not carbon alloyed. From a practical perspective, this particular characteristic for the material from which is comprised the plurality of source and drain layers 22 typically provides that the plurality of source and drain layers 22 is formed from a material selected from the group including but not limited to silicon semiconductor materials, germanium semiconductor materials and silicon-germanium alloy semiconductor materials. In particular when the carbon alloyed semiconductor channel 16' comprises a silicon-germanium-carbon alloy semiconductor material that has a silicon:germanium:carbon atomic ratio from about 0.98:0.015:0.005 to about 0.91:0.08:0.01, the plurality of source and drain layers 22 comprises a silicon-germanium alloy semiconductor material that is not carbon alloyed, and has a silicon:germanium atomic ratio from about 0.9:0.1 to about 0.7:0.3.

As is illustrated within the schematic cross-sectional diagram of FIG. 4, each of the plurality of source and drain layers 22 is preferably at least nominally coplanar with the carbon alloyed semiconductor channel 16' (i.e., within about ±6 nanometers of coplanarity), and in any event may alternatively be dimensioned to not rise above the carbon alloyed semiconductor channel 16', although the instant embodiment also contemplates circumstances where each of the plurality of source and drain layers 22 does rise above the carbon alloyed semiconductor channel 16'. The plurality of source and drain layers 22 may be formed using any of several methods and that are otherwise generally conventional in the semiconductor fabrication art. Included in particular are epitaxial chemical vapor deposition methods that include appropriate source materials.

As is understood by a person skilled in the art, when the plurality of source and drain layers 22 comprises a silicon-germanium alloy semiconductor material absent carbon alloying and the carbon alloyed semiconductor channel comprises a silicon-germanium-carbon alloy semiconductor material, a compressive stress may be introduced into the carbon alloyed semiconductor channel 16' at a magnitude from about 300 to about 900 MPa. Thus, the embodiment provides a mechanism for inversion of a type pf stress with respect to the surface semiconductor layer 16 and the carbon alloyed semiconductor channel 16'. Although the instant embodiment illustrates the invention within the context of a tensile to compressive stress inversion, given alternative and appropriate materials selections, a compressive to tensile stress inversion is also plausible.

As is further understood by a person skilled in the art, under certain circumstances the semiconductor structure whose schematic cross-sectional diagram is illustrated in FIG. 4 may provide a fully functional metal oxide semiconductor field effect transistor device within a semiconductor structure. Such circumstances will typically include incorporation of an appropriate dopant into the source and drain layers 22 so that they serve as source and drain regions absent any further processing of the semiconductor structure whose schematic cross-sectional diagram is illustrated in FIG. 4. However, for further enhanced performance, additional processing may be effected within the context of the semiconductor structure whose schematic cross-sectional diagram is illustrated in FIG. 4. Such additional processing is illustrated within the semiconductor structure whose schematic cross-sectional diagram is illustrated in FIG. 5.

Figure 5:
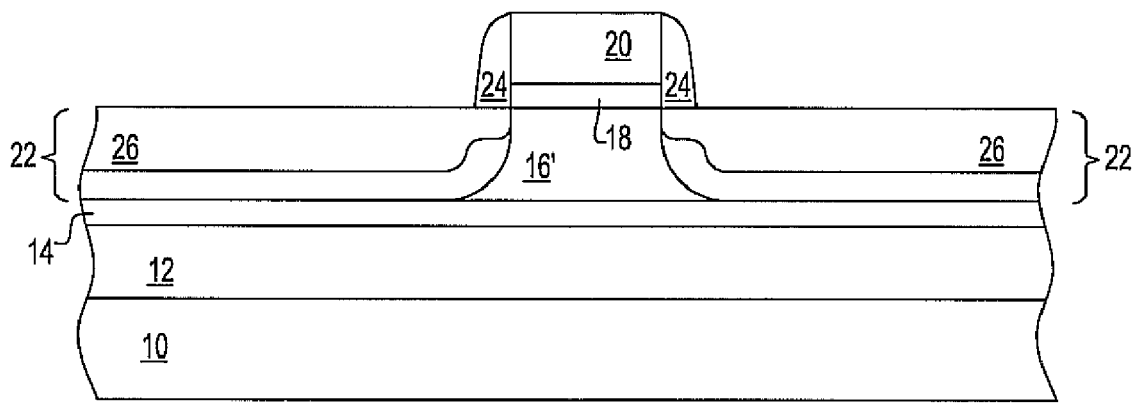

FIG. 5 first shows the results of stripping the capping layer 21 from the semiconductor structure of FIG. 4. The capping layer 21 may be stripped using methods and materials that are otherwise generally conventional in the semiconductor fabrication art. Included in particular, but also not limited, are wet chemical etch methods and dry plasma etch methods. When, for example, the capping layer 21 comprises a silicon nitride material, the capping layer 21 may be selectively stripped from the semiconductor structure whose schematic cross-sectional diagram is illustrated in FIG. 4 to provide in-part the semiconductor structure whose schematic cross-sectional diagram is illustrated in FIG. 5 while using an aqueous phosphoric acid etchant at an elevated temperature.

FIG. 5 also shows a spacer 24 located adjacent and adjoining sidewalls of the gate electrode 20 and the gate dielectric 18. The spacer 24 (which is illustrated as a plurality of layers in cross-section, but is intended as a single layer in plan-view) may comprise materials including but not limited to conductor materials and dielectric materials. Conductor spacer materials are less common, but are nonetheless known. Dielectric spacer materials are more common. The spacer materials may be formed using methods analogous, equivalent or identical to the methods that are used for forming the capping layer 21. The spacer 24 is also formed with the distinctive inward pointing spacer shape by using a blanket layer deposition and anisotropic etchback method. Typically, the spacer 24 comprises a silicon oxide dielectric material, a silicon nitride dielectric material or a combination of a silicon oxide dielectric material and a silicon nitride dielectric material.

FIG. 5 finally shows a plurality of source and drain regions 26 located and formed within the plurality of source and drain layers 22. The plurality of source and drain regions 26 comprises a generally conventional dopant appropriate to a polarity of a field effect transistor desired to be fabricated (i.e., the embodiment contemplates both an nFET and a pFET). When the field effect transistor that is illustrated in FIG. 5 comprises a pFET (i.e., as is preferred, but not limiting, within the embodiment and the invention), the source and drain regions 26 will include a p conductivity type dopant whose diffusion into the carbon alloyed semiconductor channel 16' is inhibited by the presence of the carbon alloying material within the carbon alloyed semiconductor channel 16'.

As is understood by a person skilled in the art, the plurality of source and drain regions 26 is formed using a two step ion implantation method. A first ion implantation process step within the method uses the gate electrode 20, absent the spacer 24, as a mask to form a pair of extension regions each of which extends beneath the spacer 24. A second ion implantation process step uses the gate electrode 20 and the spacer 24 as a mask to form the larger contact region portions of the plurality of source and drain regions 24, while simultaneously incorporating the pair of extension regions. Dopant levels are from about 1e19 to about 1e21 dopant atoms per cubic centimeter within each of the plurality of source and drain regions 26. Extension regions within the plurality of source and drain regions 26 may under certain circumstances be more lightly doped than contact regions with the plurality of source and drain regions, although such differential doping concentrations are not a requirement of the invention. Finally, although FIG. 5 illustrates the source and drain regions 26 as vertically contained within the source and drain layers 22, such is not intended as a limitation of the embodiment. Rather, the source and drain regions 26 may alternatively be nominally vertically coextensive (i.e., within about +/−4 nanometers) with the source and drain layers 22, or alternatively also encompass at least a portion of the intermediate semiconductor layer 14.

Figure 6:
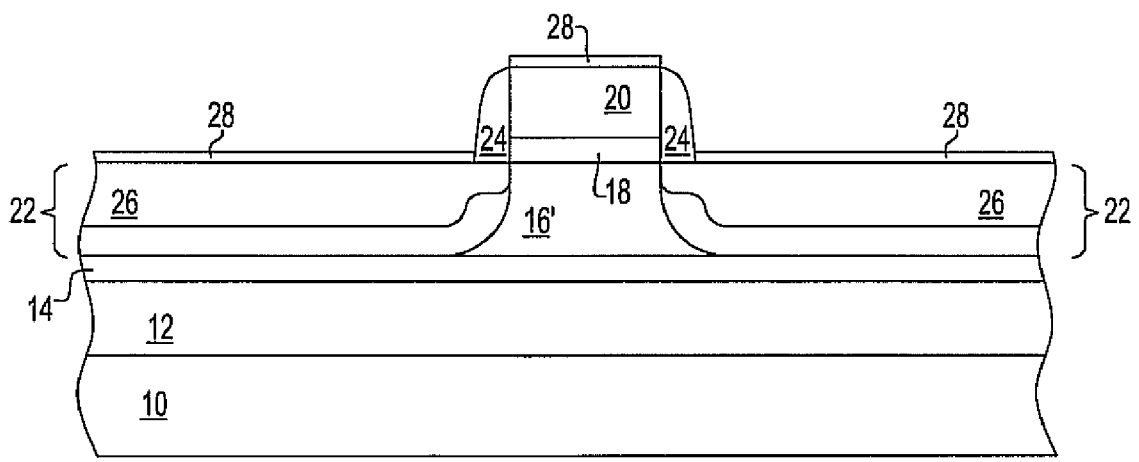

FIG. 6 shows a plurality of silicide layers 28 (i.e., more generally metal semiconductor material layers) located upon exposed silicon (i.e., or more generally other semiconductor material containing) surfaces including the source and drain regions 26 and the gate electrode 20. The silicide layers 28 may comprise any of several silicide forming metals. Non-limiting examples of candidate silicide forming metals include nickel, cobalt, titanium, tungsten, erbium, ytterbium, platinum and vanadium silicide forming metals. Nickel and cobalt silicide forming metals are particularly common. Others of the above enumerated silicide forming metals are less common. Typically, the silicide layers 28 are formed using a salicide method. The salicide method includes: (1) forming a blanket silicide forming (i.e., or alternatively metal-semiconductor forming) metal layer upon the semiconductor structure of FIG. 5; (2) thermally annealing the blanket silicide forming metal layer with silicon surfaces which it contacts to selectively form the silicide layers 28 while leaving unreacted metal silicide forming metal layers on, for example, the spacer 24; and (3) selectively stripping unreacted portions of the silicide forming metal layers from, for example, the spacer 24. Typically, the silicide layers 28 comprise a nickel silicide material or a cobalt silicide material that has a generally conventional thickness from about 10 to about 20 nanometers.

FIG. 6 shows a schematic cross-sectional diagram of a semiconductor structure in accordance with a preferred embodiment of the invention. The semiconductor structure includes a field effect device, and more particularly a field effect transistor device and most particularly a p field effect transistor device. The field effect device includes a channel region (as well as a contiguous body region therebeneath) that includes a surface layer that comprises a carbon alloyed semiconductor material (i.e., the carbon alloyed semiconductor channel 16') as well as a plurality of source and drain regions (i.e., or alternatively the source and drain layers 22) that preferably do not rise above the channel region that and that include a surface layer that comprises a semiconductor material that is not carbon alloyed. Within the instant embodiment, the carbon alloyed semiconductor channel 16' preferably comprises a silicon-germanium-carbon alloy semiconductor material and the source and drain layers 22 preferably comprise a silicon-germanium alloy semiconductor material that is not carbon alloyed. The use of the carbon alloyed semiconductor material for the channel region of the field effect device in accordance with the invention provides for inhibited dopant diffusion within the channel region of the field effect device, and thus enhanced field effect device performance. The use of different semiconductor materials for the channel region and the plurality of source and drain regions is intended to provide for a mechanical stress effect within the field effect device within the semiconductor structure. Such a mechanical stress effect also provides for an enhanced field effect device performance.

While the instant sole preferred embodiment illustrates the invention within the context of a single field effect transistor located and formed within a semiconductor-on-insulator substrate, neither the embodiment nor the invention is intended to be so limited. Rather, the embodiment also contemplates that a field effect transistor structure in accordance with the foregoing embodiment may be included within a complementary metal oxide semiconductor (CMOS) structure. Within such a CMOS structure, a field effect transistor in accordance with the invention is typically, although not necessarily exclusively, included as a p field effect transistor. Within such a CMOS structure, an n field effect transistor may be beneficially formed absent any etching and backfilling of the surface semiconductor layer 16 that is illustrated in FIG. 1 and FIG. 2. Absent any etching and backfilling, a channel region within the n field effect transistor will retain an original tensile stress of the surface semiconductor layer 16, while, as noted above, a channel region within the p field effect transistor (i.e., the carbon alloyed semiconductor channel 16') acquires a compressive stress due to etching and backfilling as discussed above.

Figure 7:
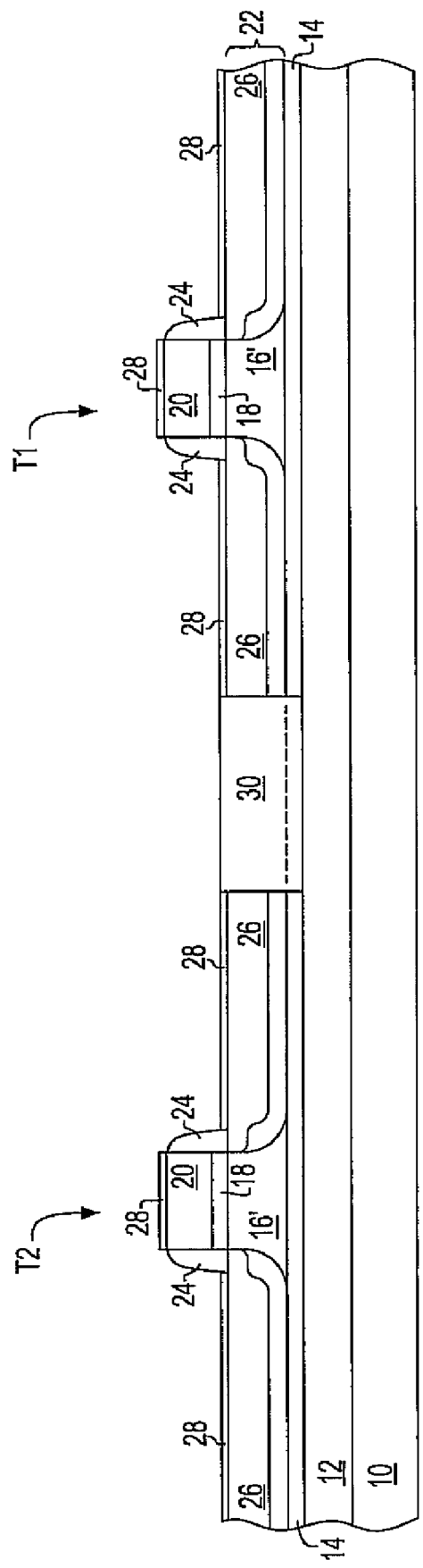
FIG. 7 shows a schematic cross-sectional diagram of the semiconductor structure in accordance with the particular embodiment of the invention, as further located within a complementary metal oxide semiconductor (CMOS) structure.

Such a CMOS semiconductor structure is illustrated in FIG. 7. The CMOS structure of FIG. 7 includes a first transistor T1 that is intended as a pFET and that corresponds with the field effect transistor whose schematic cross-sectional diagram is illustrated in FIG. 6. The CMOS structure of FIG. 7 also includes a second transistor T2 that is intended as an nFET. The pFET first transistor T1 includes the carbon alloyed semiconductor channel 16', which in accordance with discussion above includes a compressive mechanical stress. The nFET second transistor T2 includes a channel as the surface semiconductor layer 16, which in accordance with discussion above includes a tensile mechanical stress. The first transistor T1 and the second transistor T2 are separated by an isolation region 30 that may comprise materials and be formed using methods analogous, equivalent or identical to the materials and methods that are used for forming the buried dielectric layer 12.

The preferred embodiment is illustrative of the invention rather than limiting of the invention. Revisions and modification may be made to methods, materials, structures and dimensions of a semiconductor structure in accordance with the preferred embodiment, while still providing a semiconductor structure and a method for fabrication thereof in accordance with the invention, further in accordance with the accompanying claims.

What is claimed is:

1. A method for fabricating a p-type semiconductor structure comprising:
   providing a semiconductor substrate that comprises a carbon alloyed semiconductor surface layer with a tensile stress, wherein the carbon alloyed semiconductor surface layer is present in direct contact with an underlying unstrained semiconductor layer of silicon;
   forming a gate electrode on the carbon alloyed semiconductor surface layer of the semiconductor substrate;
   etching the carbon alloyed semiconductor surface layer of the semiconductor substrate while using the gate electrode as a mask stopping on the underlying unstrained semiconductor layer of silicon to form a carbon alloyed semiconductor channel aligned beneath the gate electrode; and
   forming laterally backfilling SiGe regions adjoining a remaining portion of the carbon alloyed semiconductor surface layer, wherein the SiGe regions do not include carbon and provide a source region and a drain region having a dopant of a p-type conductivity, wherein the SiGe regions convert the tensile stress in the remaining portion of the carbon alloyed semiconductor surface layer to a compressively stressed channel in which carbon of the carbon alloy semiconductor surface layer inhibits diffusion of the dopant of the p-type conductivity into the compressively stressed channel.

2. The method of claim 1 wherein the etching uses an isotropic etchant.

3. The method of claim 1 wherein the etching uses an anisotropic etchant.

4. The method of claim 1 wherein the laterally backfilling provides a completed plurality of source and drain regions.

5. The method of claim 1 wherein the laterally backfilling provides a plurality of source and drain layers into which is further implanted a plurality of source and drain regions.

6. A method for fabricating a semiconductor structure comprising:
   providing a structure including a first semiconductor material layer located over a substrate and having a first mechanical stress, wherein the first semiconductor material layer comprises silicon doped with carbon, wherein the carbon is a dopant that inhibits diffusion of source and drain dopants into a channel region of the semiconductor structure;
   etching laterally separated portions of the first semiconductor material layer to leave remaining a first semiconductor material layer mesa from which the first mechanical stress is at least in part relaxed; and
   foaming backfilled source and drain regions adjoining the first semiconductor material layer mesa a backfilling semiconductor material layer that induces a second stress that is opposite the first stress into the first semiconductor material layer mesa.

7. The method of claim 6 wherein the semiconductor structure comprises a field effect device.

8. The method of claim 1, wherein the tensile stress ranges from 200 MPa to 600 MPa.

9. The method of claim 1, wherein a compressive stress of the compressively stressed channel ranges from 300 MPa to 900 MPa.

10. The method of claim 6, wherein the first mechanical stress is a tensile stress ranging from 200 MPa to 600 MPa, and the second stress is a compressive stress ranging from 300 MPa to 900 MPa.

* * * * *